United States Patent [19]

Crawley

[11] 4,446,817

[45] May 8, 1984

[54] APPARATUS FOR VAPOR DEPOSITION OF A FILM ON A SUBSTRATE

[75] Inventor: John A. Crawley, Royston, England

[73] Assignee: Cambridge Instruments Limited, Cambridge, England

[21] Appl. No.: 330,262

[22] Filed: Dec. 14, 1981

[30] Foreign Application Priority Data

Dec. 20, 1980 [GB] United Kingdom ............... 8040921

[51] Int. Cl.³ ..................... H01L 21/20; C23C 13/08
[52] U.S. Cl. .................................. 118/725; 118/730; 219/343; 219/347
[58] Field of Search ............... 118/725, 724, 730; 219/343, 347

[56] References Cited

U.S. PATENT DOCUMENTS

| | | | |
|---|---|---|---|
| 3,608,519 | 9/1971 | Bean | 118/725 |
| 3,627,590 | 12/1971 | Mammel | 118/725 |
| 3,633,537 | 1/1972 | Howe | 118/725 |
| 4,047,496 | 9/1977 | McNeilly | 118/725 |

FOREIGN PATENT DOCUMENTS 1075398 7/1967 United Kingdom .
1281539 7/1972 United Kingdom .
1291357 10/1972 United Kingdom .

*Primary Examiner*—John D. Smith
*Attorney, Agent, or Firm*—Leydig, Voit, Osann, Mayer & Holt, Ltd.

[57] ABSTRACT

Substrates on which vapor deposition is to take place are mounted on the outside of a generally bell-shaped susceptor which is itself mounted immediately outside a similarly shaped shield which is transparent to infra-red radiation. Infra-red lamps are mounted within the shield and the radiant heat from them passes through the shield and heats the substrates through the susceptor. An outer, opaque, shield defines an annular gas passage through which reactant gases pass over the heated substrate to cause vapor deposition thereon. Purging gas may be passed between the transparent shield and the susceptor. The lamps and the susceptor may be relatively rotated. The arrangement substantially eliminates the possibility of the reactant gas causing deposition on the transparent shield which would interfere with the passage of radiant heat to the susceptor and the substrate.

19 Claims, 1 Drawing Figure

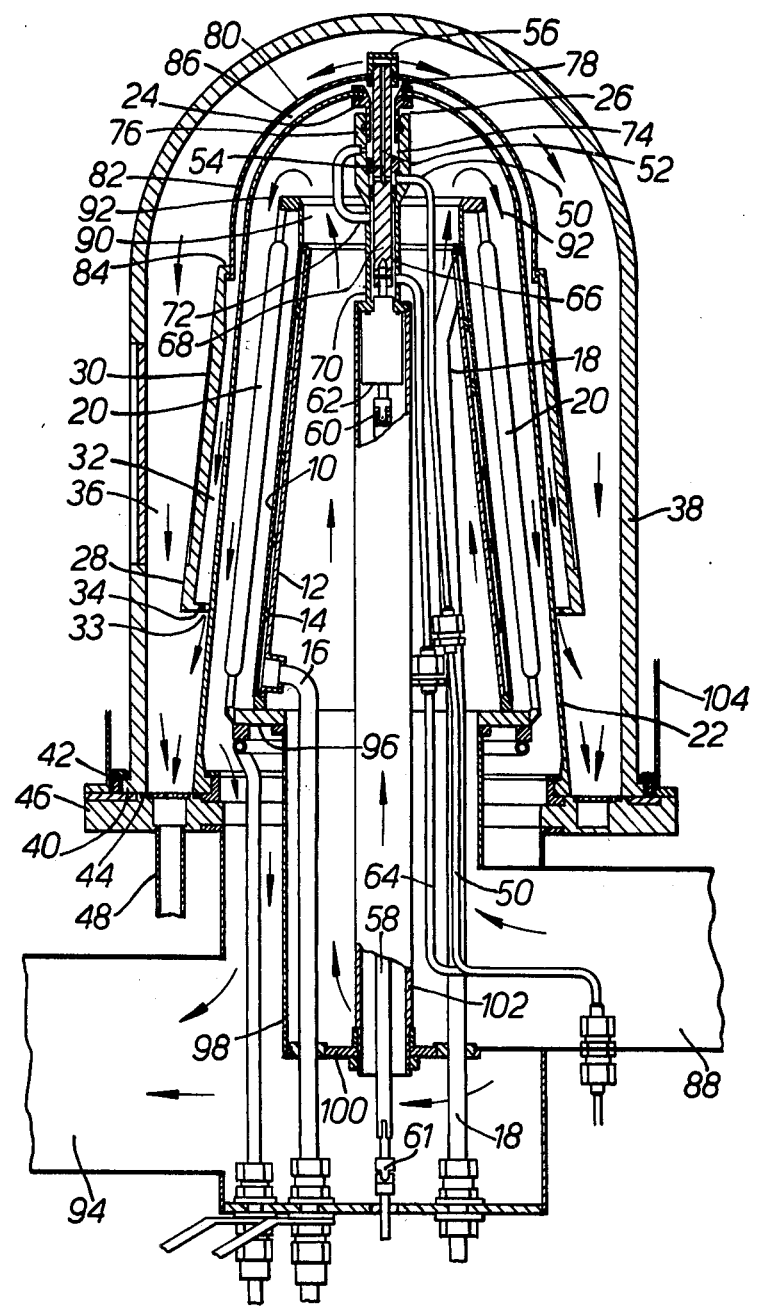

APPARATUS FOR VAPOR DEPOSITION OF A FILM ON A SUBSTRATE

BACKGROUND OF THE INVENTION

This invention relates to vapour deposition of films on substrates, particularly to vapour deposition of epitaxial films such as gallium arsenide and the like, or vapour deposition of silicon and the like, on the surface of a substrate such as is commonly used in the electronics industry.

Such vapour deposition can be achieved by heating a substrate within a reaction chamber and bringing gaseous chemical reactants into contact with the heated substrate to produce a reaction therebetween.

In order to heat the substrate, it is known to use a reaction chamber the walls of which are transparent to radiant heat energy transmitted at a predetermined short wavelength. By mounting the substrate on a susceptor (which term is used herein to mean a body which absorbs energy at the wavelength chosen), the susceptor becomes heated as a result of the absorption of the heat energy transmitted into the reaction chamber and the substrate in turn becomes heated.

U.S. Pat. No. 3,623,712 describes such a reaction chamber and process. In the procedure and apparatus described in this Patent, a reaction zone is defined by an enclosed reaction chamber the walls of which are formed of the predetermined material selected for use in the reaction and one or more substrates which are to be epitaxially coated are located therein. A susceptor is utilised to support the substrates in the reaction chamber and a gaseous chemical mixture composed of one or more suitable reactants is introduced into the reaction chamber to make contact with the heated substrates. The substrates are heated from a radiant non RF heat source, typically infra-red, intended not to heat the walls of the reaction chamber to any great extent so that the latter remain relatively cool and uncoated.

SUMMARY OF THE INVENTION

According to the invention, there is provided vapour deposition apparatus for the deposition of a film on a substrate, comprising a source of radiant heat, mounting means for mounting the substrate to be heated by the radiant heat source, means for passing reactant gas over the substrate so as to cause epitaxial vapour deposition on the heated substrate, and shielding means preventing the reactant gas coming between the source of radiant heat and the substrate.

According to the invention, there is also provided vapour deposition apparatus for the deposition of a film on a substrate, comprising a generally cylindrically shaped first shield made of a material capable of transmitting infra-red radiation, a plurality of infra-red lamps mounted substantially uniformly inside the first shield and extending parallel to each other along part of the axial length of the shield and spaced around the axis thereof, a generally cylindrical susceptor mounted coaxially of and outside the first shield so as to define a first fluid passageway with the first shield, means on the susceptor for defining a plurality of locations for receiving substrates whereby the surfaces of the substrates on the susceptor receive infra-red radiation through the first shield and the susceptor thereby heating the substrates, a second generally cylindrical shield mounted coaxially with and outside the susceptor so as to define therewith a second fluid passageway, means sealing the ends of the first and second shields and the susceptor, means for passing reactant gas through the second passageway and over the heated substrates so as to cause epitaxial vapour deposition on the substrates, and means for passing a purging fluid through the first passageway.

According to the invention, there is further provided a method of effecting vapour deposition of an epitaxial film on a substrate, comprising the steps of applying heat to the substrate through a susceptor on one face of which a surface of the substrate is mounted, passing reactant gas over the opposite surface of the substrate so as to cause vapour deposition of the epitaxial film on the substrate, and shielding the reactant gases from coming between the susceptor and the radiant heat energy.

DESCRIPTION OF THE DRAWING

Vapour deposition apparatus embodying the invention will now be described, by way of example, with reference to the accompanying drawing in which the single FIGURE is an elevation of the apparatus in cross-section through its central axis.

DESCRIPTION OF PREFERRED EMBODIMENTS

A reaction chamber for vapour depositing films on substrates is shown. The apparatus comprises a frusto-conical reflector having an outer reflecting surface 10 and an inner surface 12 which are spaced apart by spacers 14 to define a water passage therethrough which is supplied with cooling water via a pipe 16. The return flow of cooling water is via pipe 18.

Around the reflector and spaced therefrom are located thirty 2 Kw infra-red lamps 20. In the cross-section, only two of the lamps are shown.

The lamps are surrounded by another frusto-conical member 22 having an upper generally closed end. This member consitutes a transparent screen through which infra-red radiation can pass but represents a gaseous barrier. The upper end is closed as in a bell-jar except for an opening which is sealed by appropriate seals and is secured to a flange of a collar 26 forming part of a multiple joint at the upper end of the inside of the apparatus and which will be described in more detail below.

Around the member 22 which may, for example, be formed from transparent quartz, is located a graphite susceptor 28 which is also generally frusto-conical in shape but has ten sides facing outermost on which gallium arsenide substrates can be mounted, one of which substrates is shown at 30. The graphite susceptor is itself silicon carbide coated.

The susceptor 28 is spaced from the shield 22 and defines an annular gas passage 32 through which hydrogen is passed in a generally downward direction. A small annular space 33 exists between an inward flange 34 of the lower end of the susceptor and the shield 22 through which the gas can escape into a larger gas-tight compartment.

Around the suceptor 28 and forming a totally gas-tight compartment 36 is an outer cover 38 which is also similar in shape to a bell-jar housing and which is formed from opaque quartz. For convenience the outer cover need not be of a frusto-conical shape but may be truly cylindrical or otherwise shaped to optimise performance, with a hemispherical curved upper closed end.

The lower end of the housing 38 is formed with an annular foot 40 which is received in an annular slot 42 with a gas-tight seal, and rests on a further seal 44 in a base plate 46. Through the base plate extends a port 48 through which gas can pass to a vacuum pump (not shown) from the space 36.

Reactant gases for depositing material on the substrates pass through an inlet pipe 50 through a gland into a central rotating sleeve 52 having an axial bore 54 which communicates with apertures in an end cap 56 through which the gas can pass into the chamber 36.

The sleeve 52 is itself rotated by means of a drive 58 through at least universal couplings 60, 61 and a vacuum seal 62.

Hydrogen gas or an inert gas for purging the space between the shield 22 and the rear of the susceptor 28 is introduced into the apparatus via a pipe 64 from a suitable source and is conveyed via an annular gap 66 between the central rotating drive stem 68 and an outer cylindrical sleeve 70 to a pipe connection 72 which serves to communicate between the annular space 66 and a second annular space 74 between the upper end of the sleeve 70 and the central rotating sleeve 52.

At the upper end, the cylindrical number 70 is of increased diameter at 76 and accommodates the sleeve 26 as previously described and in this region the annular gap through which the hydrogen passes is defined by the inside diameter of the sleeve 26 and the member 52.

The upper end of the sleeve 26 is flared so as to provide an annular exit at 78 through which the hydrogen can pass into the annular space 32.

In order to keep the hydrogen away from the process or reactant gases which exit from the cap 56, a generally hemispherical shell 80 is sealed to the member 52 below the cap 56 and extends around the domed end 82 of the shield 22 and is sealingly secured to the upper end of the susceptor at 84.

The space between the two generally hemispherical shells 82 and 80 serves as the hydrogen gas conduit to the space 32.

In order to reduce the transfer of heat from the lamps 20 to the domed shield 22, cooling air is pumped into the apparatus through inlet port 88 and this passes up through the hollow interior of the reflector 12 and passes through the generally circular open end 90 of the reflector assembly and passes back down through the generally annular space between the array of lamps 20 and the interior of the domed shield 22 as denoted by the arrows 92. At the lower end of the shield 22, gases pass into an exit port 94 and the air is either cooled and recirculated or simply evacuated to atmosphere with or without cooling.

In order to separate the incoming cooling air from the outgoing air passing into the exit port 94, the lower end of the reflector assembly is closed off by an annular plate 96 having a central cylindrical tubular extension 98 the lower end of which is closed by an end plate 100 through which pipes 16 and 18 pass and centrally through which the drive shaft 58 passes.

The latter is separated from the cooling air by a tubular shield 102 which is sealed and secured to the plate 100 at its lower end and at its upper end provides a support for the member 70 previously referred to.

If required a cover of metal or other protective material may be provided for fitting over the whole of the apparatus, a part of which is shown at 104.

The apparatus is advantageous because it minimises the possibility of the internal wall of the reaction chamber through which the radiant heat has to pass becoming coated or partially coated with the material being deposited. Such coating or partical coating would be particularly disadvantageous if the material being deposited were gallium arsenide but can also be disadvantageous with the other materials.

The apparatus is not limited to use for epitaxial deposition but may also be used in other vapour deposition processes.

What is claimed is:

1. Vapour deposition apparatus for the deposition of a film on a substrate, comprising
   a source of radiant heat,
   mounting means for mounting the substrate to be heated by the radiant heat source,
   means defining a passageway over the substrate,
   means for passing reactant gas through the passageway so as to cause vapour deposition on the heated substrate, and
   shielding means preventing the reactant gas coming between the source of radiant heat and the substrate.

2. Apparatus according to claim 1, including reflector means positioned to reflect radiant heat from the said source towards the substrate.

3. Apparatus according to claim 1, in which
   the source of radiant heat is mounted so as to direct the radiant heat to one surface of the substrate, whereby the substrate becomes heated, and
   the shielding means includes means directing the reactant gas over another surface of the substrate and preventing the reactant gas coming between the source of radiant heat and the said one surface of the substrate or in contact with the radiant heat source.

4. Apparatus according to claim 1, in which
   the shielding means comprises a first shield embracing the radiant heat source and having at least a portion capable of transmitting the radiant heat,
   the means defining the said passageway comprises a second shield outside the first shield and confining the reactant gas to pass over the substrate, and
   the mounting means mounts the substrate outside the first shield and inside the second shield adjacent to the said portion of the first shield whereby to be heated by radiant heat passing therethrough.

5. Apparatus according to claim 4, in which the first shield and the mounting means define a second passageway for the passage of purging gases.

6. Apparatus according to claim 5, in which the mounting means comprises a susceptor, and in which the first shield is generally bell-shaped and mounted within the susceptor which is of the same general shape but spaced from the first shield by the said second passageway, the susceptor defining a plurality of locations each receiving a said substrate.

7. Apparatus according to claim 6, in which the source of radiant heat comprises a plurality of infrared lamps mounted within the first shield and spaced substantially uniformly around its axis.

8. Apparatus according to claim 7, including means defining an axially extending reflector around which the said lamps are mounted.

9. Apparatus according to claim 8, including means for passing coolant through and within the reflector.

10. Apparatus according to claim 6, in which the second shield comprises a shield of generally bell-shape and mounted outside the first shield and the susceptor.

11. Apparatus according to claim 6, including means for causing relative rotation, with respect to the said axis, between the lamps on the one hand and the susceptor and substrate on the other hand.

12. Apparatus according to claim 6, for use where the substrate to be coated is gallium arsenide or silicon, in which the susceptor is made from graphite and coated with silicon carbide.

13. Apparatus according to claim 4, in which the first shield is made of generally transparent quartz.

14. Apparatus according to claim 4, in which the second shield is made of opaque quartz.

15. Vapour deposition apparatus for the deposition of a film on a substrate, comprising
    a generally cylindrically-shaped first shield made of a material capable of transmitting infra-red radiation,
    a plurality of infra-red lamps mounted substantially uniformly inside the first shield and extending parallel to each other along part of the axial length of the shield and spaced around the axis thereof,
    a generally cylindrical susceptor mounted coaxially of and outside the first shield so as to define a first fluid passageway with the first shield,
    means on the susceptor defining a plurality of locations for receiving substrates whereby the surfaces of the substrates on the susceptor receive infra-red radiation through the first shield and the susceptor thereby heating the substrates,
    a second generally cylindrical shield mounted coaxially with and outside the susceptor so as to define therewith a second fluid passageway,
    sealing means sealing the ends of the first and second shields and the susceptor,
    means for passing reactant gas through the second passageway and over the heated substrates so as to cause expitaxial vapour deposition on the substrates, the reactant gas being prevented from coming between the infrared lamps and the susceptor by the first shield and the sealing means, and
    means for passing a purging fluid through the first passageway.

16. Apparatus according to claim 15, including means for passing a cooling gas over the lamps.

17. Apparatus according to claim 15, including reflector means extending axially of the first shield and having the lamps spaced around it so as to reflect their radiant heat outwardly.

18. Apparatus according to claim 17, including means for passing cooling fluid through the reflector means.

19. Apparatus according to claim 15, including means for causing relative rotation, about the said axis, between the lamps on the one hand and the susceptor with the substrates thereon on the other hand.

* * * * *